United States Patent
DiPietro et al.

(10) Patent No.: US 9,660,573 B2
(45) Date of Patent: May 23, 2017

(54) PASSIVE SOLAR PANEL COOLING

(71) Applicant: GLOBALFOUNDRIES Inc., Grand Cayman (KY)

(72) Inventors: Richard A. DiPietro, Campbell, CA (US); Thomas J. Fleischman, Poughkeepsie, NY (US); Richard Hutzler, Tucson, AZ (US); Keith B. Maddern, Tucson, AZ (US); Mitchell Montanez, Tucson, AZ (US); William K. Morse, Tucson, AZ (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/589,171

(22) Filed: Jan. 5, 2015

(65) Prior Publication Data
US 2016/0197579 A1    Jul. 7, 2016

(51) Int. Cl.
| H02S 20/00 | (2014.01) |
| H02S 20/23 | (2014.01) |
| H01L 31/052 | (2014.01) |
| H01L 31/0525 | (2014.01) |
| H02S 40/42 | (2014.01) |
| H02S 40/44 | (2014.01) |

(52) U.S. Cl.
CPC ................................. *H02S 40/425* (2014.12)

(58) Field of Classification Search
CPC ............ G06F 17/5004; G06F 17/5009; G06F 2217/02; G06F 2217/08; Y02E 10/47; Y02E 10/50; Y02E 10/44; Y02E 10/60; F24J 2200/04; Y02B 10/12; H02S 50/00; H02S 40/425; H02S 40/44; H02S 20/00; H02S 20/23; H01L 31/042; H01L 31/052; H01L 31/0525

See application file for complete search history.

(56) References Cited

U.S. PATENT DOCUMENTS

| 5,614,033 | A | 3/1997 | Robinson et al. |
| 5,666,261 | A | 9/1997 | Aguilera |
| 6,069,794 | A | 5/2000 | Chuang |
| 6,201,313 | B1 * | 3/2001 | Nakamats ............... F03D 9/002 290/43 |
| 7,147,041 | B2 | 12/2006 | Mitchell et al. |
| 7,589,968 | B1 | 9/2009 | Oliver |

(Continued)

FOREIGN PATENT DOCUMENTS

CN           202094162           12/2011

*Primary Examiner* — Jennifer Michener
*Assistant Examiner* — Mayla Gonzalez Ramos
(74) *Attorney, Agent, or Firm* — Anthony Canale; Andrew M. Calderon; Roberts Mlotkowski Safran Cole & Calderon, P.C.

(57) ABSTRACT

A solar panel enclosure converts sunlight to electricity. To remove the large amount of heat from the enclosure a chambered heat exchanger (CHE) is thermally coupled thereto. An air temperature differential is created between chamber air in a CHE portion and chamber air within a CHE heat exchanging portion. When a threshold thermal gradient is reached, air pressure that keeps the chamber air static is overcome creating airflow within the chamber. The airflow draws cooler ambient air from a chamber inlet. Heat from the enclosure is transferred to the cool air and is exhausted from a chamber outlet.

2 Claims, 5 Drawing Sheets

(56) References Cited

U.S. PATENT DOCUMENTS

| | | | |
|---|---|---|---|
| 2005/0044862 A1* | 3/2005 | Vetrovec | B01D 5/0066 62/93 |
| 2005/0236142 A1* | 10/2005 | Boudreaux | F28F 3/02 165/80.3 |
| 2011/0017275 A1 | 1/2011 | Zhou et al. | |
| 2011/0209742 A1* | 9/2011 | Narayanamurthy | F24D 11/003 136/246 |
| 2011/0232866 A1 | 9/2011 | Zaffetti | |

* cited by examiner

PASSIVE SOLAR PANEL COOLING

FIELD

Embodiments of invention generally relate to the heat removal systems and heat removal components utilized for solar panel cooling, and more particularly to a chambered passive heat exchanger for solar panel cooling.

DESCRIPTION OF THE RELATED ART

A solar panel collects light from the sun to create electricity. One or many solar panels may be packaged within an enclosure. The enclosure may be mounted to a frame that is fixed to a ground based mount, such as a pole mount, foundation mount, ballasted footing mount, etc. The enclosure may also be mounted to a frame attached to a roof support such as a truss, etc. The enclosure may also be mounted to a tracker that senses the direction of the sun and tilts the modules as needed to generally be perpendicular to the sun for maximum exposure to the light. Further, the enclosure may also be mounted to a fixed rack that holds the enclosure stationary as the sun moves across the sky. The fixed rack sets the angle at which the enclosure is held. Tilt angles may be associated with the installation's latitude. The solar panel may be a dark color and may be heated by the absorption of radiant heat.

Since the efficiency of the electricity conversion decreases as the temperature of the solar panel increases, one of the main challenges in utilizing solar panels is coping with the vast amount of heat produced by the sunlight.

SUMMARY

In an embodiment of the present invention, a system for cooling a solar panel enclosure includes a solar panel enclosure that converts sunlight to electricity and a chambered heat exchanger. In another embodiment, the chambered heat exchanger includes a heat exchanging portion that absorbs heat from the solar panel enclosure, an exhaust portion exterior to the solar panel enclosure, and a chamber extending through the heat exchanging portion and exhaust portion.

In yet another embodiment of the present invention, a method includes positioning the heat exchanging portion of the chambered heat exchanger with the solar panel enclosure such that the exhaust portion of the chambered heat exchanger extends from the solar panel enclosure and thermally contacting the heat exchanging portion with the solar panel enclosure;

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
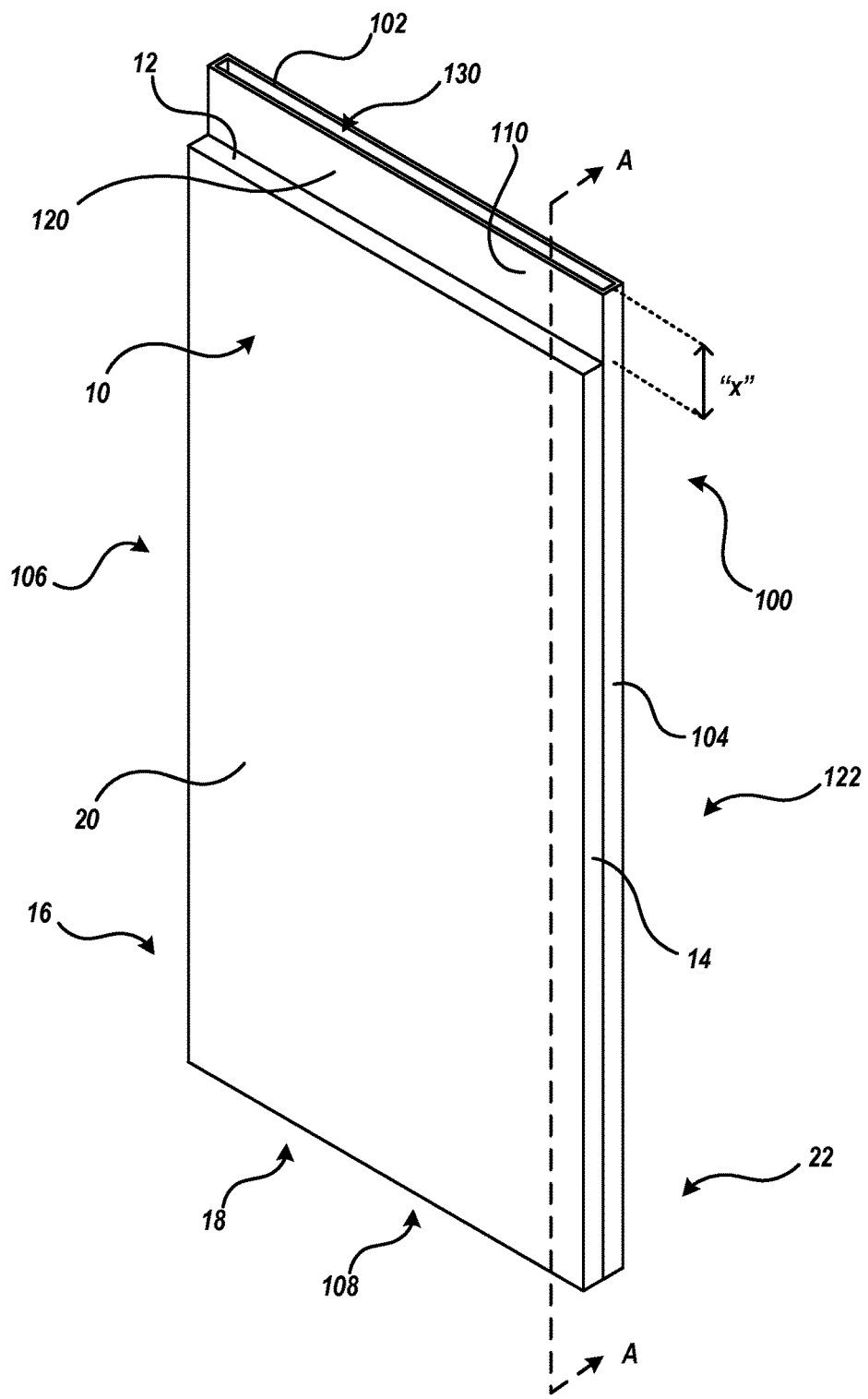
FIG. 1 depicts a chambered passive heat exchanger thermally coupled to a solar panel enclosure, according to various embodiments of the present invention.

Details of the claimed embodiments are disclosed herein. However, it is understood that the disclosed embodiments are merely illustrative of the structures, devices, systems, methods, etc. that may be embodied in various forms. These exemplary embodiments are provided so that this disclosure will be thorough and complete and will convey the scope of this invention to those skilled in the art. In the description, details of well-known features and techniques may be omitted to avoid unnecessarily obscuring the presented embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

FIG. 1 depicts a chambered heat exchanger 100 thermally coupled to a solar panel enclosure 10. Solar panel enclosure 10 may include one or more solar panels (e.g., photovoltaic module, solar cells, etc.) that convert sun light to electricity. The enclosure 10 may be mounted to a structure (not shown) such as a frame that is fixed to a ground based mount, a frame attached to a roof support such as a truss, etc., a tracker that senses the direction of the sun, a fixed rack that holds the enclosure stationary as the sun moves across the sky. Solar panel enclosure includes a top surface 12, right surface 14, left surface 16, bottom surface 18, light collecting surface 20, and backside surface 22.

Chambered heat exchanger 100 includes top surface 102, a right surface 104, a left surface 106, bottom surface 108, thermal coupling surface 110, and backside surface 122. Chambered heat exchanger 100 further includes at least one chamber 130 or opening extending from the top surface 102 to the bottom surface 108. In certain embodiments, chambered heat exchanger 100 includes multiple chambers 130. Chambered heat exchanger 100 further includes an exhaust portion 120 that extends exterior to solar panel enclosure. For example, top surface 102 extends beyond top surface 12 by a dimension "x." Chambered heat exchanger 100 further includes a heat exchanging portion 140 for passive cooling of solar panel enclosure 10. Chambered heat exchanger 100 may be made from a thermally conductive material (e.g. a metal, aluminum, copper, etc.).

In certain embodiments, chambered heat exchanger 100 is thermally coupled to a solar panel enclosure 10 by adjoining thermal coupling surface 110 with backside surface 22. In certain implementations a thermal interface material (e.g. thermal gel, thermal grease, liquid metal, etc.) may be utilized to maximize the contact between thermal coupling surface 110 and backside surface 22. Unless otherwise specified, thermally coupled shall mean that the proximity of a first structure against a second structure allows for heat to transfer between the first structure and the second structure or visa versa.

Figure 2:
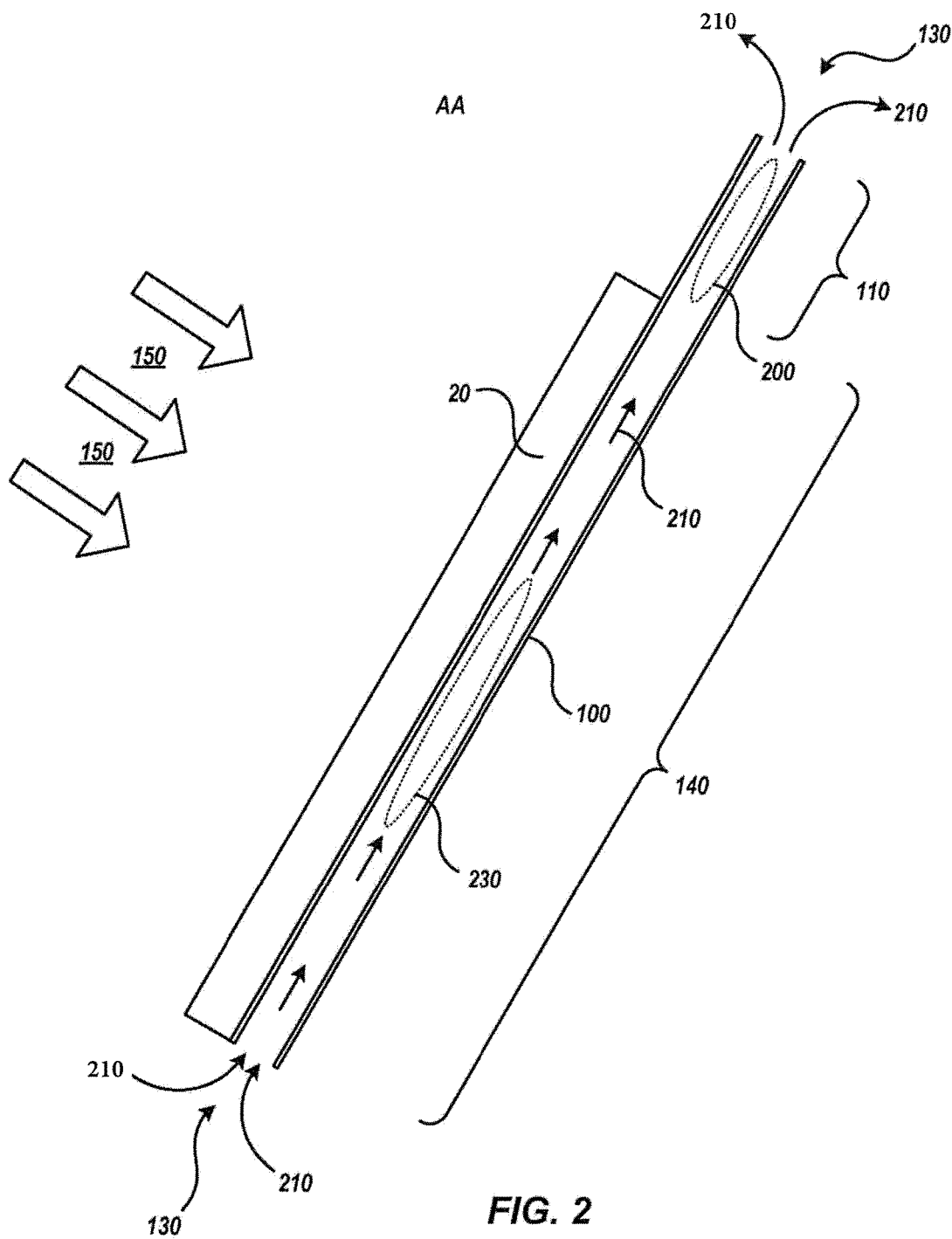
FIG. 2-FIG. 4 depict cross sectional views of a chambered passive heat exchanger thermally coupled to a solar panel enclosure, according to various embodiments of the present invention.

FIG. 2 depicts a cross section view AA of chambered passive heat exchanger 100 thermally coupled to solar panel enclosure 10. Enclosure 10 collects sunlight 150 and converts sunlight 150 to electricity. A large amount of heat within enclosure 10 is produced by sunlight 150. Therefore, to remove the heat from enclosure 10 chambered heat exchanger 100 is thermally coupled thereto. Heat is also produced in exhaust 120 and is transferred to air 200 within chamber 130 within the exhaust 120. The air 200 is heated and a thermal gradient is created relative to the air 200 and air 230 also within chamber 130 within the heat exchanging portion 140. When a threshold thermal gradient is reached, air pressure within chamber 130 that generally keeps the air static is overcome resulting in airflow 210. The airflow 210 draws relatively cooler ambient air from a chamber 130 inlet and heat from enclosure 10 is transferred to the cool air within heat exchanging portion 140 thereby cooling enclosure 10. The heated air is then exhausted at a chamber 130 outlet. Once the static barrier is overcome airflow 210 is generally maintained by convection. In certain embodiments, the dimension "x," in which top surface 102 extends beyond top surface 12 may be chosen to achieve the heating air 200 to a threshold temperature to create the necessary temperature gradient between air 200 and air 230 to overcome the static barrier.

Figure 3:
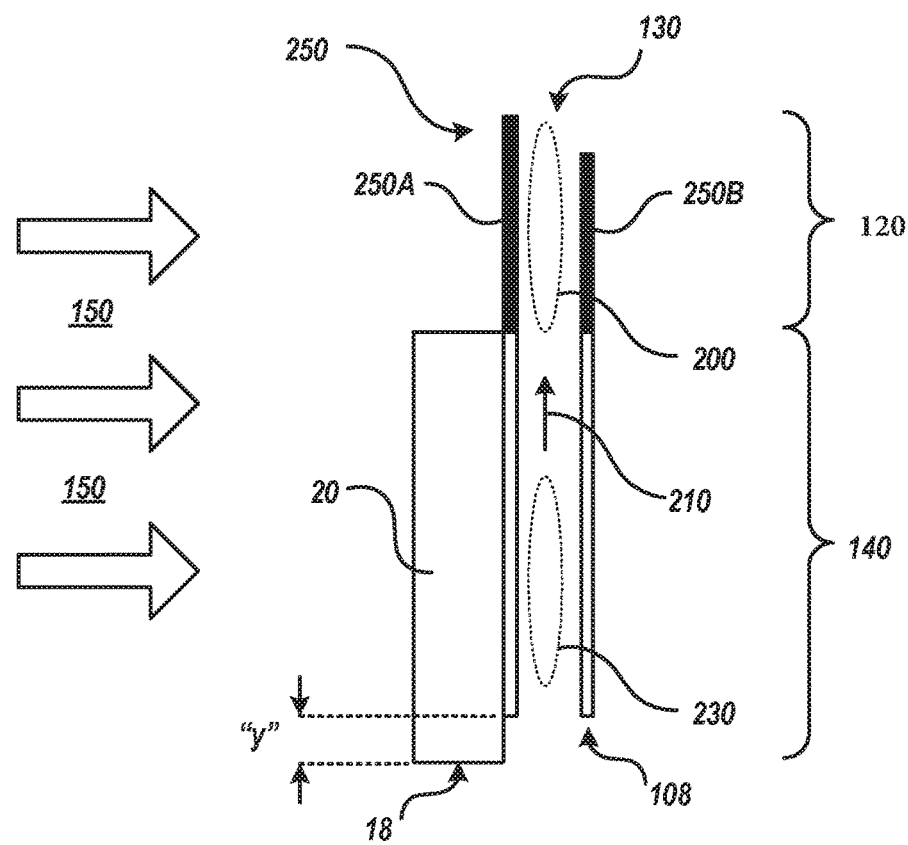

FIG. 3 depicts a cross section view of chambered passive heat exchanger 100 thermally coupled to solar panel enclosure 10. In certain embodiments, exhaust 120 may be a dark color to maximize the absorption of sunlight 150 for efficient initiation of airflow 210. The dark color may be applied to exhaust 120 by a painting, powder coat, enameling, heat tempering, chemical and/or electroplating, or equivalent coloring process to efficiently heat air 200 relative to air 230 to break the static barrier to establish airflow 210. In certain embodiments, the inlet of chamber 130 is recessed so that this opening is shaded by the solar panel enclosure 10. In other words, bottom surface 108 may be recessed from bottom surface 18 by a dimension y.

Figure 4:
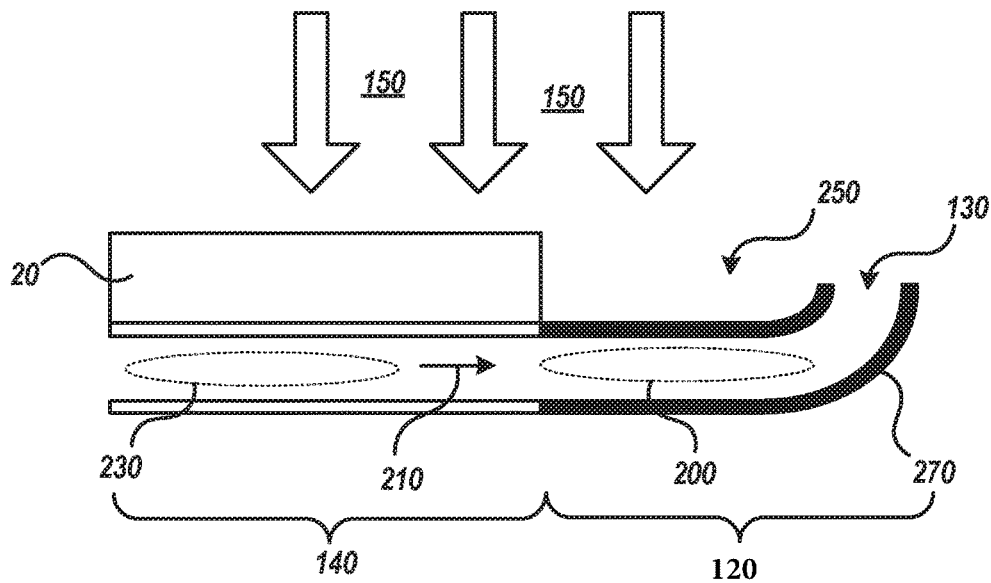

FIG. 4 depicts a cross section view of chambered passive heat exchanger 100 thermally coupled to solar panel enclosure 10. In certain embodiments, the outlet of chamber 130 may be angled to be generally parallel to horizontal. If the enclosure is located near the equator the solar panel will convert light to electrically more effectively if the enclosure is generally horizontal. To efficiently expel the heated air from the chamber 130 outlet, the exhaust 250 may include an angled portion, curved portion 270, etc. to position the chamber 130 outlet generally parallel to horizontal. The exhaust may include a first wall 250A and a second wall 250B, and in certain embodiments, wall 250A may be longer than wall 250B relative to the top surface 12 or visa versa.

FIG. 5-FIG. 12 depict respective shaped chambers 130 of chambered passive heat exchanger 100. Though FIG. 5-FIG. 12 depict a variety of shapes arranged in a variety of patterns, sizes, orientations, etc., the shapes depicted are exemplary and specific arrangement shall not be limited to those shown.

Figure 5:
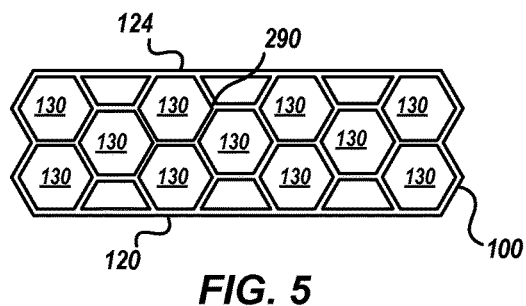
FIG. 5-FIG. 12 depict exemplary chambers of a chambered passive heat exchanger, according to various embodiments of the present invention.
Figure 6:
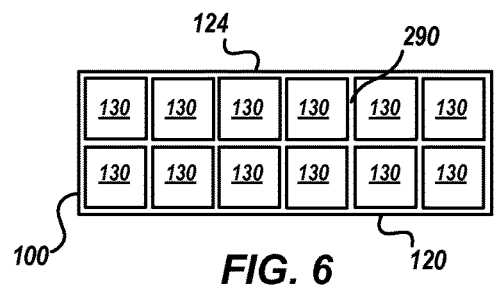
Figure 7:
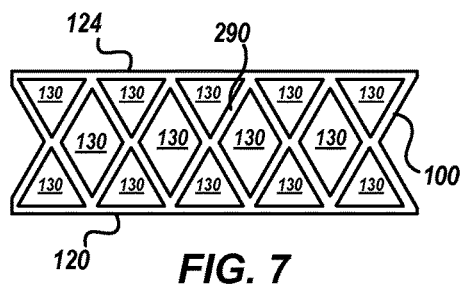
Figure 8:
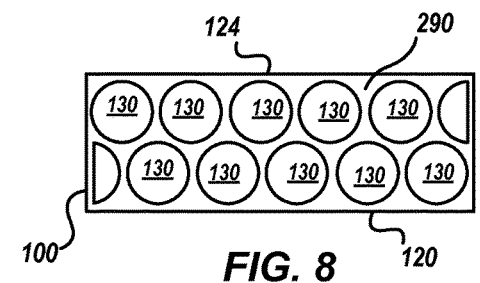
Figure 9:
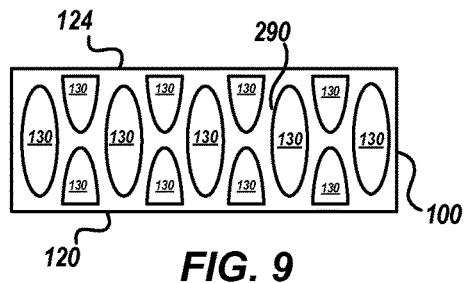
Figure 10:
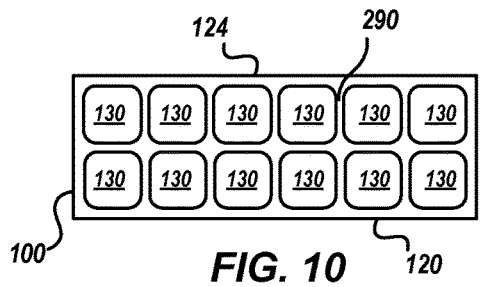
Figure 11:
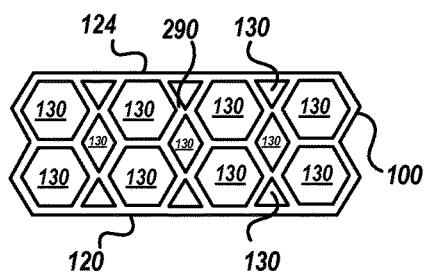
Figure 12:
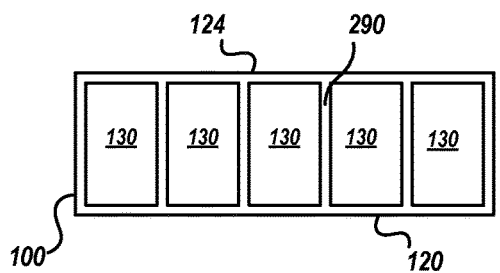

As shown in FIG. 5, the passive heat exchanger 100 may include multiple chambers 130 of hexagonal shape, partial hexagonal shape. As shown in FIG. 6, the passive heat exchanger 100 may include multiple chambers 130 of square shape, partial square shape. As shown in FIG. 7, the passive heat exchanger 100 may include multiple chambers 130 of a first shape and multiple chambers 130 of a second shape. For example, first chambers 130 may be a square, rectangle, circular, triangular, diamond, etc. shape and second chambers 130 of a different shape. As shown in FIG. 8 and FIG. 9, the passive heat exchanger 100 may include multiple chambers 130 of circular and/or circular like shape. As shown in FIG. 10, the passive heat exchanger 100 may include multiple filleted or chamfered chambers 130. As shown in FIG. 11, the passive heat exchanger 100 may include multiple chambers 130 of a first shape, multiple chambers 130 of a second shape, and multiple chambers 130 of a third shape. For example, first chambers 130 may be a square, rectangle, circular, triangular, diamond, hexagonal, etc. shape, second chambers 130 of a different shape, and a third chambers 130 of yet a different shape. Finally, as shown in FIG. 11, the passive heat exchanger 100 may include multiple chambers 130 of a rectangular. When multiple chambers 130 are utilized in exchanger 100, each chamber 130 may be separated from adjacent chamber(s) 130 by one or more ribs 290. In embodiments, the number of ribs 290 is generally minimized. For example, a rib 290 may be shared by multiple chambers 130. For example, hexagon shaped chambers 130 minimize ribs 290 since a rib 290 is shared by chambers 130 to each side and above and below the rib 290.

Figure 13:
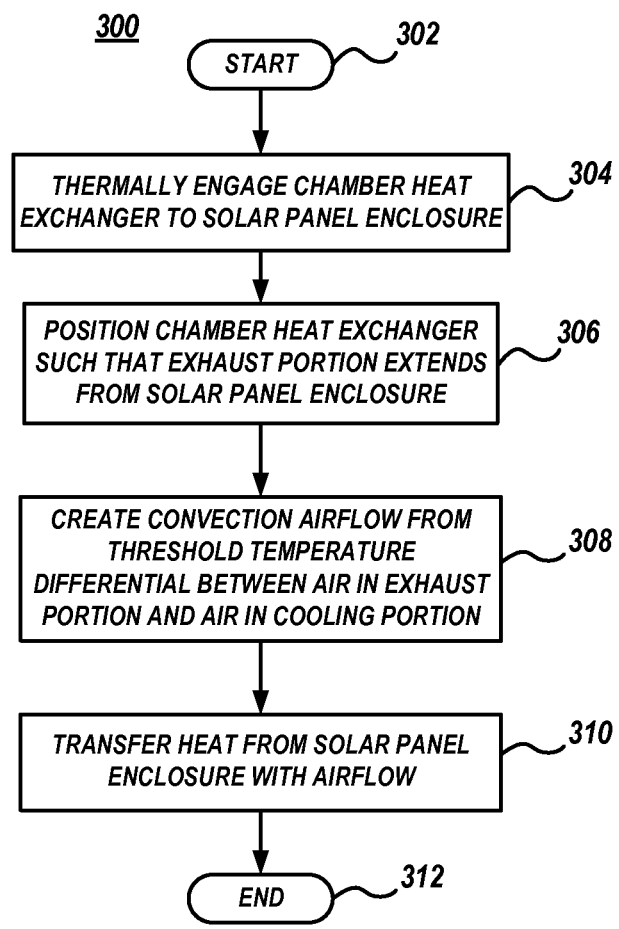
FIG. 13 depicts a method of passive chambered heat removal, according to various embodiments of the present invention.

FIG. 13 depicts a method 300 of passive chambered heat removal, according to various embodiments of the present invention. Method 300 may be utilized to passively remove heat from a solar panel enclosure 10 with a chambered passive heat exchanger 100 and begins at block 302 and continues with thermally engaging chambered passive heat exchanger 100 to solar panel enclosure 10 (block 304). For example, chambered heat exchanger 100 is thermally coupled to solar panel enclosure 10 by adjoining thermal coupling surface 110 with backside surface 22. In certain implementations, a thermal interface material (e.g. thermal gel, thermal grease, liquid metal, etc.) may be utilized to maximize the contact between thermal coupling surface 110 and backside surface 22.

Method 300 may continue with positioning the chambered heat exchanger 100 such that exhaust 120 extends exterior to solar panel enclosure 10 (block 306). For example, top surface 102 of chambered heat exchanger 100 may extend beyond top surface 12 of solar panel enclosure 10 by dimension "x."

Method 300 may continue with creating airflow 210 via the heating of air 200 within a chamber 130 relative to air 230 within the chamber 130 (block 308). For example, heat produced in exhaust 120 is transferred to air 200 within chamber 130 within the exhaust 120. Air 200 is heated and a thermal gradient is created relative to air 230. When a threshold thermal gradient is reached, air pressure within chamber 130 that keeps the air static is overcome resulting in airflow 210. Once the static barrier is overcome airflow 210 is generally maintained by convection.

Method 300 may continue with transferring heat from solar enclosure 10 to chambered heat exchanger 100 (block 310). For example, airflow 210 draws relatively cool air from a chamber 130 inlet and heat from enclosure 10 is transferred to the cool air within heat exchanging portion 140 thereby cooling enclosure 10. The heated air is then exhausted at a chamber 130 outlet. Method 300 ends at block 312.

References herein to terms such as vertical, horizontal, etc. are made by way of example, and not by way of limitation, to establish a frame of reference. Horizontal as contemplated herein is a plane asymptotic to the earth (e.g., parallel to the ground, etc.), regardless of the actual spatial orientation of the solar panel enclosure. The term vertical refers to a direction perpendicular to the horizontal. Terms, such as "on", "above", "below", "side", "top", "bottom", "upper", "lower", "over", "beneath", "under", etc. are defined with respect to the horizontal plane. It is understood that various other frames of reference may be employed for describing the present invention without departing from the spirit and scope of the present invention.

The invention claimed is:

1. A system for cooling a solar panel enclosure comprising:
   a solar panel enclosure that converts sunlight to electricity; and
   a chambered heat exchanger comprising a thermal coupling surface attached to a backside of the solar panel enclosure, and comprising a heat exchanging portion that absorbs heat from the solar panel enclosure, and an exhaust portion exterior to the solar panel enclosure which extends beyond a top surface of the solar panel enclosure such that a surface is exposed, and a chamber extending through the heat exchanging portion and exhaust portion,
   wherein the exhaust portion absorbs heat from the sunlight and further comprises:
      a first wall; and
      a second wall which includes the thermal coupling surface, the second wall being longer than the first wall and includes a darkened surface extending beyond the top surface of the solar panel, the darkened surface maximizes absorption of sunlight to heat air within a chamber within the exhaust portion to create a thermal gradient relative to the air, wherein after a period of heating, a threshold thermal gradient is reached to establish the air flow.

2. A chambered heat exchanger comprising:
   a heat exchanging portion that is heated by a solar panel enclosure that converts sunlight to electricity, the heat exchanging portion being heated through a thermal coupling surface of the heat exchanging portion attached to a backside surface of the solar panel enclosure;
   an exhaust portion exterior to the solar panel enclosure that is heated by the sunlight, the exhaust portion having a darkened surface extending beyond a top surface of the solar panel enclosure such that a surface is exposed; and
   a chamber extending through the heat exchanging portion and exhaust portion,
   wherein darkened surface of the exhaust portion breaks a static barrier to establish the air flow, and
   wherein the exhaust portion comprises a first wall and a second wall which includes the thermal coupling surface, the second wall being longer than the first wall and including a darkened surface which extends beyond the top surface of the solar panel, the darkened surface maximizes absorption of sunlight to heat air within a chamber within the exhaust portion to create a thermal gradient relative to the air, wherein after a period of heating, a threshold thermal gradient is reached to establish the air flow and a bottom surface of the first wall and the second wall are recessed from a bottom surface of the solar panel enclosure.

* * * * *